United States Patent
Chien et al.

(10) Patent No.: US 6,975,974 B2
(45) Date of Patent: Dec. 13, 2005

(54) OVERLAY ERROR MODEL, SAMPLING STRATEGY AND ASSOCIATED EQUIPMENT FOR IMPLEMENTATION

(75) Inventors: Chen-Fu Chien, Hsinchu (TW);
Kuo-Hao Chang, Taichung (TW);
Chih-Ping Chen, Hsinchu (TW);
Shun-Li Lin, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 791 days.

(21) Appl. No.: 09/920,034

(22) Filed: Aug. 1, 2001

(65) Prior Publication Data

US 2002/0183989 A1 Dec. 5, 2002

(30) Foreign Application Priority Data

Feb. 26, 2001 (TW) ........................ 90104309 A

(51) Int. Cl.[7] ............................................. G06F 17/10
(52) U.S. Cl. ........................ 703/2; 700/109; 700/121; 716/20
(58) Field of Search ............................. 703/2; 700/109, 700/118–121; 716/19–21; 702/83, 150, 155; 250/548; 430/22; 355/53

(56) References Cited

U.S. PATENT DOCUMENTS

| | | | | | |
|---|---|---|---|---|---|
| 4,833,621 | A | * | 5/1989 | Umatate ........................ | 716/21 |
| 4,918,320 | A | * | 4/1990 | Hamasaki et al. .......... | 250/548 |
| 5,448,333 | A | * | 9/1995 | Iwamoto et al. .............. | 355/53 |
| 5,498,501 | A | * | 3/1996 | Shimoda et al. .............. | 430/22 |
| 5,502,311 | A | * | 3/1996 | Imai et al. ................... | 250/548 |
| 5,805,866 | A | * | 9/1998 | Magome et al. .............. | 716/19 |
| 6,442,496 | B1 | * | 8/2002 | Pasadyn et al. ............... | 702/83 |
| 6,535,774 | B1 | * | 3/2003 | Bode et al. .................. | 700/109 |
| 6,556,959 | B1 | * | 4/2003 | Miller et al. .................... | 703/2 |

OTHER PUBLICATIONS

Buller et al., Manufacturing Issues Related to RTP Induced Overlay Errors in a Global Alignment Stepper Technology, IEEE Transactions on Semiconductor Manufacturing, vol. 9, No. 1, Feb. 1996, p. 108–114.*

Hebb et al., The Effect of Patterns on Thermal Stress During Rapid Thermal Processing of Silicon Wafers, IEEE Transactions on Semiconductor Manufacturing, vol. 11, No. 1, Feb. 1998, p. 99–107.*

Preil et al., A New Approach to Correlating Overlay and Yield, SPIE Conference on Metrology, Inspection, and Process Control, for Microlithography XIII, vol. 3677, Mar. 1999, p. 208–16.*

Shamoun et al., Assessment of Thermal Loading–Induced Distortions in Optical Photomasks Due to e–Beam Multipass Patterning, 42nd Int. Con. on Electron, Ion, and Photon Beam Tech/Nanofabrica–tion, American Vacuum Society, Nov./Dec. 1998, p. 3558–62.*

Goodwin et al., Characterizing Overlay Registration of Concentric 5X and 1X Stepper Exposure Fields Using Interfield Data, SPIE Conference on Metrology, Inspection, and Process Control for Microlithography XI, vol. 3050, Mar. 1997, p. 407–17.*

Chien et al., Sampling Strategy and Model to Measure and Compensate the Overlay Errors, SPIE Conference on Metrology, Inspection, and Process Control for Microlithography XV, vol. 4344, Feb./Mar. 2001, p. 245–56.*

Hong et al., Interfield Sampling Method Dependency of Overlay and Global Alignment, SPIE Conference on Metrology, Inspection, and Process Control for Microlithography XIV, vol. 3998, Feb./Mar. 2000, p. 856–62.*

Arnold, Overlay Simulator for Wafer Steppers, SPIE vol. 922, Optical/Laser Microlithography, Mar. 1988, p. 94–105.*

* cited by examiner

Primary Examiner—Russell Frejd
(74) Attorney, Agent, or Firm—J. C. Patents

(57) ABSTRACT

In the manufacturing of VLSI circuits, production of overlay is a critical step. To obtain a higher resolution and alignment accuracy in microlithographic process, overlay errors must be measured so that overlay errors can be reduced to a tolerable level. This invention provides an overlay error model and a sampling strategy. Utilizing the overlay model and sampling strategy, a device for measuring overlay errors is also designed.

5 Claims, 15 Drawing Sheets

(a)

(b)

(a) (b) (c) (d)

(e) (f) (g) (h)

(iii)

(iv)

(v)

(vi)

(vii)

(vii)

(ix)

(x)

OVERLAY ERROR MODEL, SAMPLING STRATEGY AND ASSOCIATED EQUIPMENT FOR IMPLEMENTATION

CROSS-REFERENCE TO RELATED APPLICATION

This application claims the priority benefit of Taiwan application serial no. 90104309, filed on Feb. 26, 2001.

BACKGROUND OF THE INVENTION

1. Field of Invention

The present invention relates to a method for manufacturing semiconductor devices and the associated equipment required by the method. More particularly, the present invention relates to an overlay error model, a sampling strategy and associated equipment for implementation.

REFERENCE ARTICLES

1. Armitage, J. D. and J. P. Kirk, Proceedings SPIE: Integrated Circuit Metrology, Inspection and Process Control II, 921, 207–222 (1988).
2. Arnold, W. H, Proceedings SPIE: Optical/Laser Microlithography, vol. 922, 94–105 (1988).
3. Arnold, W. H, Proceedings SPIE: Optical Microlithography, 394, 87–98 (1983).
4. Brink, M. A., C. G. M. Mol and R. A. George, Proceedings SPIE: Integrated Circuit Metrology, Inspection, and Process Control II, 921, 180–197 (1988).
5. Draper, N. R. and H. Smith, Applied Regression Analysis, John Wiley & Sons (1981).
6. Hasan, T. F., S. U. Katzman and D. S. Perloff, IEEE Transactions on Electronic Devices, 27 (12), 2304–2312 (1980)
7. Lin, Z. and W. Wu, IEEE Transaction on Semiconductor Manufacturing, 12, 229–237 (1999).
8. MacMillen, D. and W. D. Ryden, Proceedings SPIE: Optical Microlithography-Technology, 334, 78–89 (1982).
9. Magome, N. and H. Kawar, Proceedings SPIE vol. 2197, 990–996 (1994).
10. Perloff, D. S., IEEE Journal of Solid-State Circuits, 13(4), 436–444 (1978).
11. Peski, C. K., Solid State Technology, 25(5), 111–115 (1982).
12. Rangarajan, B., M. Templeton, L. Capodieci, R. Subramanian and A. Scranton, Proceedings SPIE, vol. 3332, 348–359 (1998).
13. Schmidt, D. and G. Charache, Journal of Vacuum Science and Technology, B9 (6), 3237–3240 (1991).

2. Description of Related Art

Microlithography is an important technique closely related to the manufacturing of semiconductor wafers. Conventional microlithographic stations using a scanning projection method for manufacturing very-large-scale-integrated (VLSI) circuits have now been largely replaced by step-and-repeat systems. To produce semiconductor devices capable of operating normally, the overlays for patterning out various layers must be designed within an acceptable tolerance level.

High resolution and alignment are important factors for producing quality devices on a silicon wafer during photographic exposure. FIG. 1 is a sketch of a conventional dual alignment system used by semiconductor manufacturers. In the dual alignment system 10, an alignment detector emits a light beam 12. The light beam 12 travels through a reticle 13 and a protection lens 14 to arrive at an alignment mark 16 on a wafer 15 so that the wafer 15 is aligned. After wafer 15 alignment, various pattern layers above the wafer 15 are exposed. Therefore, controlling the alignment accuracy of various overlapping overlays is important. To improve production yield, overlay errors due to misalignment during photo-exposure using a microlithographic machine must be reduced to a tolerable level.

The following is a list of commonly used symbols in error determination and their respective meanings:

(x, y): an intra-field coordinate system relative to the center of an exposure field and related to photomask factors;

(X, Y): an inter-field coordinate system relative to the center of a wafer and related to wafer factors;

$d_x$, $d_y$: intra-field overlay error relative to intra-field coordinate system (x, y);

$d_X$, $d_Y$: inter-field overlay error relative to inter-field coordinate system (X, Y);

$d_{x+X}$: the sum of intra-field overlay error along horizontal axis x and inter-field overlay error along horizontal axis X;

$d_{y+Y}$: the sum of intra-field overlay error along vertical axis y and inter-field overlay error along vertical axis Y;

$T_x$, $T_y$: intra-field translation error;

$T_X$, $T_Y$: inter-field translation error;

$T_{x+X}$: the sum of intra-field horizontal translation and inter-field horizontal translation;

$T_{y+Y}$: the sum of intra-field vertical translation and inter-field vertical translation;

$E_{X+Y}$: inter-field expansion error;

$M_x$, $M_y$: intra-field magnification error;

$R_x$, $R_y$: intra-field rotation error;

$R_X$, $R_Y$: inter-field rotation error;

rx, ry: residual error after intra-field compensation, indicating random error; and $r_X$, $r_Y$: residual error after inter-field compensation, indicating random error.

The appearance of overlay errors can be attributed to intra-field and inter-field errors. A 'field' refers to an exposure field on a wafer each time machine-alignment is required. The 'intra-field overlay error' refers to the problem caused by a misalignment between a light source filter lens and a mask. Therefore, intra-field overlay error is measured using the center point of a sampled exposure field as the origin. In addition, the so-called 'inter-field overlay error' refers to the problem caused by a misalignment between the mask and the wafer. Hence, the inter-field overlay error is measured using the center point of the wafer as the origin.

FIG. 2 is a diagram showing a method of measuring overlay error. As shown in FIG. 2(a), the overlay error is the displacement error [7] (displacement error is represented by d) between an image exposure field 21 and a previous image exposure field 22. The values listed out as x1, x2, y1 and y2 are the actually measured parameters of overlay errors representing the relative displacement of two different size rectangular exposure fields. As shown in FIG. 2(b), the response variables of the overlay errors can be indicated as follows:

$$d_{x+X} = \frac{x1 - x2}{2} \quad (1)$$

$$d_{y+Y} = \frac{y1 - y2}{2} \quad (2)$$

where $d_{x+X}$ represents the sum of intra-field overlay error along horizontal axis x and inter-field overlay error along horizontal axis X and $d_{y+Y}$ represents the sum of intra-field overlay error along vertical axis y and interfield overlay error along vertical axis Y. When $d_{x+X}=0$, this indicates that the small rectangle is located in exactly the center of the large rectangle horizontally. Hence, overlay error in the x direction is zero. Similarly, when $d_{y+Y}=0$, this indicates the small rectangle is located in exactly the center of the large rectangle vertically. Hence, overlay error in the y direction is zero. If $d_{x+X}=0$ and $d_{y+Y}=0$ at the same time, this indicates that the two consecutive image exposures produce no overlay errors.

FIG. 3 is a sketch showing a sampling method for inter-field overlay and intra-field overlay on a wafer. The central point of an exposure field 31 on the wafer 35 has a coordinate (X, Y) relative to an origin at the center of wafer 35. Exposure fields at different locations are also selected accordingly. This particular mode of point selection is referred to as an inter-field sampling. An overlay point 33 surrounding the exposure field 31 may be selected. The overlay point 33 has a coordinate (x, y) relative to an origin at the center of the exposure field 31. This particular mode of point selection is referred to as an intra-field sampling.

Due to an increase in threshold dimension and a reduction of feature size in VLSI circuits, factors affecting overlay errors have become increasingly complicated. Table 1 is an outline of all the factors that may produce overlay errors according to the investigation by Schmidt [13]. The principle factors include system problems, stepper problems, reticle accuracy, linewidth variation and wafer distortion.

TABLE 1

Major factors leading to overlay errors

| Source of Problem | Overlay Errors |
|---|---|
| System | Vibration |
| | Temperature |
| Stepper | Alignment Error |
| | Lens Distortion (Optical Alignment) |
| | Wafer Clamping |
| | Wafer Table Errors |
| Reticle Accuracy | Reticle In-plane Distortion |
| | Pattern Placement Error |
| | Reticle Clamping |
| Linewidth Error | Wafer (exposure, development, etching) |
| | Reticle (exposure, development, etching) |
| Wafer Distortion | Flatness/Curvature |
| | Pattern Movement/Slip |

The factors leading to intra-field overlay errors and inter-field overlay errors are presented in FIGS. 4 and 5. FIG. 4 is a sketch showing the factors related to intra-field overlay errors. FIG. 5 is a sketch showing the factors related to inter-field overlay errors. Mask-related intra-field overlay errors include translation, rotation and magnification while wafer-related inter-field overlay errors include expansion and rotation.

An overlay error model having six parameters has previously been developed by Perloff [10]. In this model, errors contributed by translation ($T_X$, $T_Y$), rotation ($R_X$, $R_Y$) and wafer expansion ($E_X$, $E_Y$) are added together to produce a linear sum for describing inter-field overlay errors. The following formulas are used.

$$d_X = T_X - R_X Y + E_X X \quad (3)$$

$$d_Y = T_Y - R_Y X + E_Y Y \quad (4)$$

However, factors related to stage motion are absent in Perloff's model.

In Hasan et al. [6], registration data and specially designed control structures are incorporated to obtain error data. The data is used to estimate the accuracy of stage-stepping in (x, y) coordinates and perform necessary rectification accordingly. McMillen and Ryden [8] introduce step-and-repeat system, thereby expanding the model used by Hasan [6] to develop an image field placement deviation (IFPD) model. The IFPD model takes into account intra-field errors such as translation ($T_x$, $T_y$), rotation ($R_x$, $R_y$), unequal edges ($t_1$, $t_2$), magnification ($M_x$, $M_y$) and 3-dimensional distortion (E). The errors are described by the following formulas.

$$d_x = T_x + M_x - R_x y + t_1 x^2 + t_2 xy - E(x^3 + xy^2) \quad (5)$$

$$d_y = T_y + R_y x + M_y y + t_1 xy + t_2 y^2 - E(yx^2 + y^3) \quad (6)$$

In addition, Peski [11] has also developed a technique that utilizes the wafer-to-reticle aligning capacity of a wafer stepper to carry out precision control of the wafer exposure equipment. Peski incorporates stepper parameters into the design. The stepper parameters include an X marking factor, a Y marking factor, an X positive crossing and a Y positive crossing. The following formulas are used.

$$d_x = S_x[\text{int}(C/5) - 1.5][0.45] + M[C - 5\{\text{int}(C/5)\} - 2][0.09] + [\sin a][R - 5\{\text{int}(R/5)\} - 2][0.09] + [\sin b][R - 9.5][0.09] \quad (7)$$

$$d_y = S_y[\text{int}(R/5) - 1.5][0.45] + M[R - 5\{\text{int}(R/5)\} - 2][0.09] + [\sin a][C - 5\{\text{int}(C/5)\} - 2][0.09] \quad (8)$$

where

Sx: X marking factor;
Sy: Y marking factor;
C: 0–19 columns;
R: 0–19 rows;
M: Magnification;
a: die rotation angle;
b: array positive crossing angle;
int: integral sign Arnold [3] discovers that a principle factor in misalignment is the distortion of lines parallel to the x-axis or the y-axis by a scanning stepper. Arnold makes due consideration to parameters including grid errors, lens errors and distortion along x, y direction. Moreover, lens errors caused by 3-dimensional lens distortion are also considered.

Brink [4] has developed an overlay model with due consideration of intra-field and inter-field effects. The intra-field model is based on the investigation by MacMillen and Ryden [8] with further incorporation of 5-dimensional distortion parameters. The following formulas are produced.

$$d_x = \tau_x + M_x x - R_x y - \tau_{xx} x^2 - \tau_{yx} xy + W_x y^2 + D_{3x} x(x^2+y^2) + D_{5x} x(x^2+y^2)^2 + r_x \quad (9)$$

$$d_y = \tau_y + M_y x - R_y - \tau_{xy} x^2 - \tau_{yy} xy + W_y x^2 + D_{3y} y(x^2+y^2) + D_{5y} y(x^2+y^2)^2 + r_y \quad (10)$$

where $\tau_{xx}$, $\tau_{xy}$: intra-field slant coefficients;
$\tau_{yy}$, $\tau_{yx}$: inter-field slant coefficients;
$W_x$: clamping distortion in the x direction;
$W_y$: clamping distortion in the y direction;
$D_{3x}$, $D_{3y}$: 3-dimensional distortion coefficients; and
$D_{5x}$, $D_{5y}$: 5-dimensional distortion coefficients.

The inter-field model of Brink et al. is a combination of the model by Perloff [10] and the one by Arnold [3] with regard to the distortion parameters. The following formulas are derived.

$$d_X = T_X + E_X X - R_X Y + B_X Y^2 + r_X \quad (11)$$

$$d_Y = T_Y + E_Y Y - R_Y X + B_Y X^2 + r_Y \quad (12)$$

In addition, Lin and Wu [7] combine the intra-field error and the inter-field error in both the x direction and the y direction to produce the following formulas.

$$d_{x+X} = T_X - R_X Y + M_X X + B_X Y^2 + T_x - R_x + M_x X - T_{xx} X^2 - \quad (13)$$
$$T_{yx} XY + W_x y^2 + D_{3x} x(x^2 + y^2) + D_{5x} x(x^2 + y^2)^2 +$$
$$D_{7x} x(x^2 + y^2)^3 + r_x$$

$$d_{y+Y} = T_Y - R_Y X + M_y y + B_y X^2 + T_y + R_y x + M_y y - T_{xy} xy - \quad (14)$$
$$T_{yy} y^2 + W_y x^2 + D_{3y} y(x^2 + y^2) + D_{5y} y(x^2 + y^2)^2 +$$
$$D_{7y} y(x^2 + y^2)^3 + r_y$$

where $B_x$, $B_y$ represents step distortion coefficients.

Table 2 lists all the parameters considered in major overlay models.

TABLE 2 a listing of all the parameters considered in major overlay models

| Authors (year) | Parameters in Overlay Model |
|---|---|
| Perloff (1978) | Translation |
|  | Rotation |
|  | Expansion |
| MacMillen and Ryden (1982) | Translation |
|  | Rotation |
|  | Expansion |
|  | Unequal Lens Edges |
|  | Lens Distortion |
| Peski (1982) | Marking Factors |
|  | Array Crossings |
|  | Lens Distortion |
|  | Magnification Ratio |
| Arnold (1983) | Translation |
|  | Rotation |
|  | Expansion |
|  | Unequal Lens Edges |
|  | Lens Distortion |
|  | Distortion Coefficients |
| Brink et al. (1988) | Translation |
|  | Rotation |
|  | Expansion |
|  | Unequal Lens Edges |
|  | 3-dimensional Lens Distortion |
|  | 5-dimensional Lens Distortion |
|  | Distortion Coefficients |
| Lin and Wu (1998) | Translation |
|  | Rotation |
|  | Magnification |
|  | Intra-field Slant Angle |
|  | Clamping Distortion |
|  | Multiple-Stage Distortion |

According to the aforementioned description, the theoretic model of conventional overlay error such as the ones shown in equations (13) and (14) has altogether 26 parameters. In real applications, such a system is complicated and costly to implement in a common manufacturing facility. Many investigations regarding the factors that may lead to overlay errors, their mathematical model as well as method of controlling the overlay errors have been conducted. However, conventional models are rarely implemented in production. This is because the many parameters considered by overlay models often differ from the data measured by a typical correcting system. Therefore, the parameters in most theoretical models and the actual measured values must be compromised. In addition, the cost of making overlay measurements and the number of overlay samplings on a wafer are restricted. In general, more samples have to be taken if more parametric values are required. To boost overlay precision with a limited number of measurement, a good sampling strategy must be selected in addition to from finding a suitable overlay error model.

SUMMARY OF THE INVENTION

Accordingly, one object of this invention is to provide an overlay model for measuring overlay errors. The overlay model is based on measurable and rectifiable parameters in a correcting system. According to the overlay model, a sampling procedure is also provided so that an optimal sampling strategy is found. Thereafter, according to the parameters and the model, various balancing acts and deductions are executed so that the overlay errors are compensated to within a tolerable range. Ultimately, overlay errors in microlithographic process are minimized.

A second object of this invention is to provide a model for assessing overlay errors and sampling procedure so that a model having the best sampling strategy is found. Thereafter, the overlay errors are compensated so that precision of overlay pattern is improved.

A third object of this invention is to provide a model and a sampling procedure for producing an overlay error measuring and compensating device.

To achieve these and other advantages and in accordance with the purpose of the invention, as embodied and broadly described herein, the invention provides a model for assessing overlay errors. The parameters in the model include inter-field translation, magnification, rotation, expansion and non-positive crossing as well as intra-field translation, magnification and rotation. These parameters are selected according to measurement parameters and statistics of an actual stepper machine. The integrative overlay error model uses the following formulas:

$$d_{x+X} = T_{x+X} + E_X X - (N+\theta)Y + M'_x x - R_y y + r_{x+X} \quad (23)$$

$$d_{y+Y} = T_{y+Y} + E_y Y - (\theta - N)X + M'_y y + R_y x + r_{y+Y} \quad (24)$$

In addition, this invention also provides a sampling procedure based on the aforementioned overlay model. The sampling strategy includes the following steps.

In step (a), the state within the intra-field, that is, the number and positions of the selected overlays within the intra-field are determined. Each type of sampling state and sum of the overlays are then determined. Next, each type of intra-field overlay sampling state similarly on the wafer is ranked before the locations and actual overlay error values of each overlay type of the sampling states within the intra-field are measured.

In step (b), the least square method is utilized using the measured values to obtain the coefficients according to the overlay error model formulas (23) and (24). Next, related square coefficient values between each type of overlay sampling states within the intra-field and the overlay model (or R-square represents the degree of the assessed variance that can be explained by the model) are computed. The highest related square coefficient among the overlay sampling states within the intra-field is selected so that model compensation is improved.

In step (c), a plurality of inter-field overlay sampling patterns is determined. With the patterns, the locations and number of types of overlay sampling states within the inter-field are determined. And together with the selected highest square coefficient from the overlay states within the intra-field in step (b), the locations and actual overlay error values of each overlay sampling pattern within the inter-field are then measured.

In step (d), the least square method is utilized with the measured values in step (c) to obtain the coefficients in the model formulas (23) and (24). Related square coefficient values between each overlay sampling pattern within the inter-field and the overlay model are computed. An inter-field overlay sampling pattern having the highest related square coefficients is selected, and thereby finding the optimal sampling pattern that corresponds to the model and improving the effect of model compensation.

In step (e), the combination of intra-field overlay sampling state and inter-field overlay sampling pattern and its relationship with the model are determined so that the highest related coefficients are obtained. Then, compensation and modification using the measured overlay errors for the same stepper machine are performed, so that the number of overlay errors of the exposed patterns is reduced to a tolerable range and yield of semiconductor device is improved.

Another object of this invention is to provide a device designed according to the aforementioned strategic sampling procedure. The device can be used inside a step-exposure system for reducing overlay errors of pattern on a wafer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
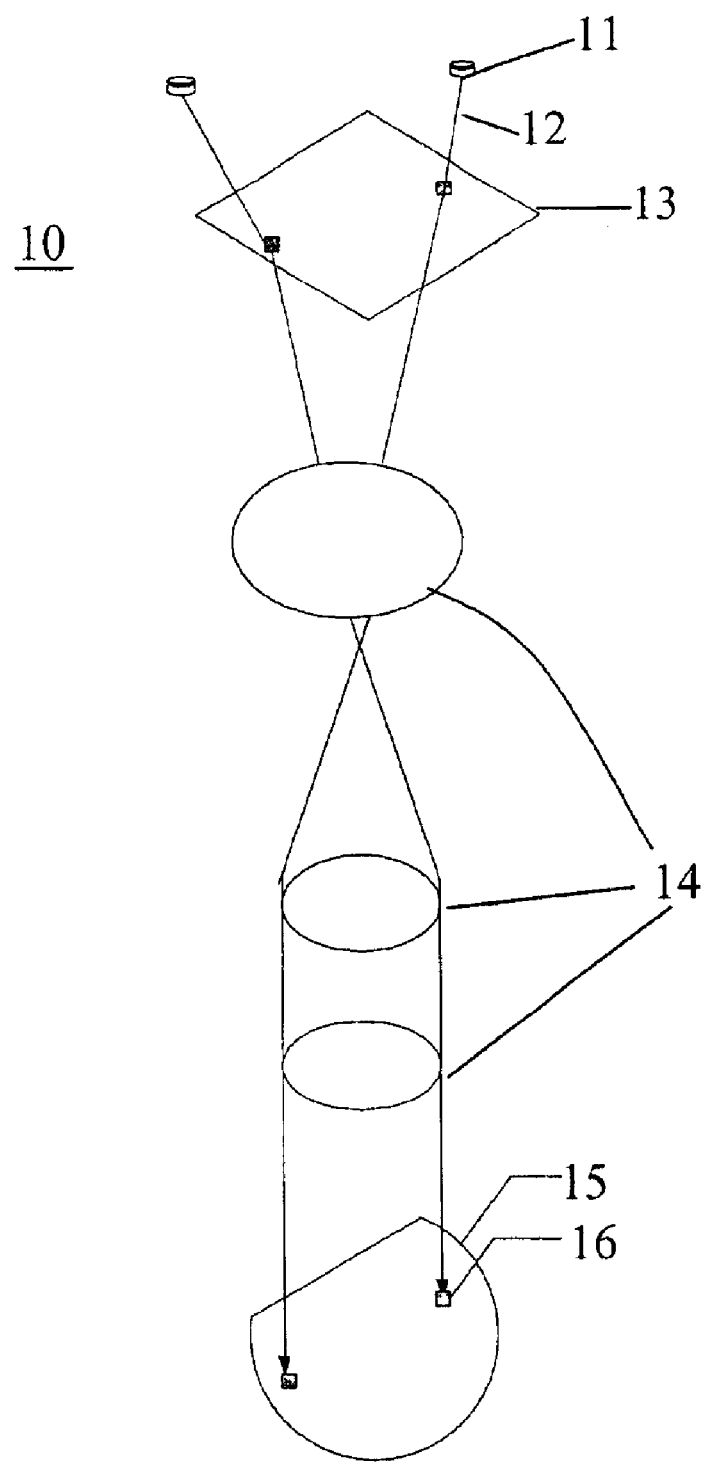
FIG. 1 is a sketch of a conventional dual alignment system used by semiconductor manufacturers.
Figure 2:
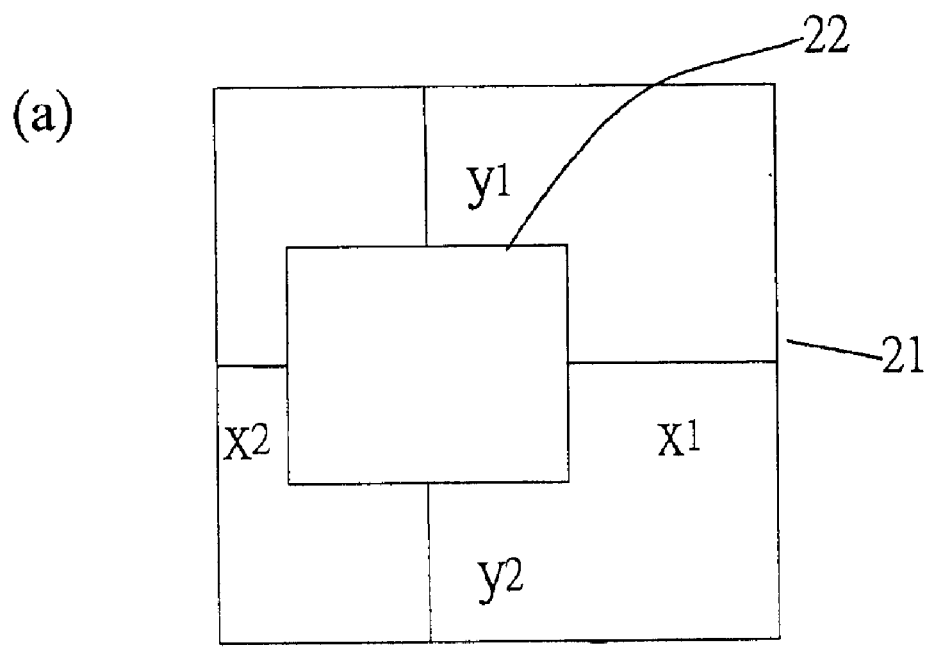
FIG. 2 is a diagram showing a method of measuring overlay error.
Figure 2:
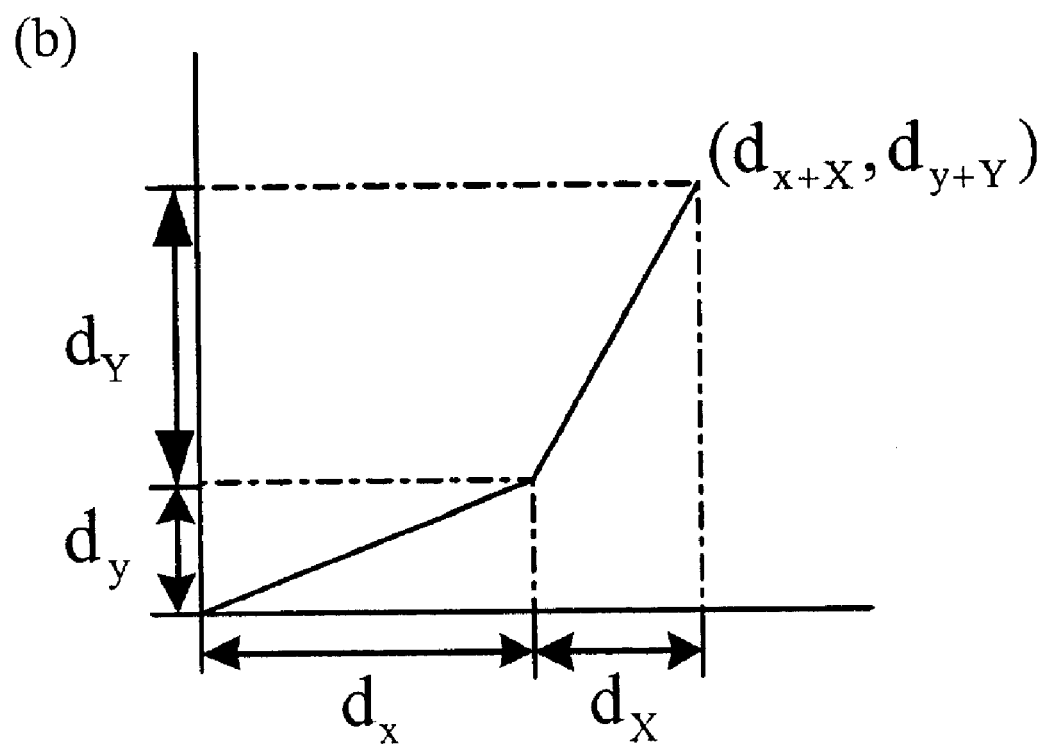
Figure 3:
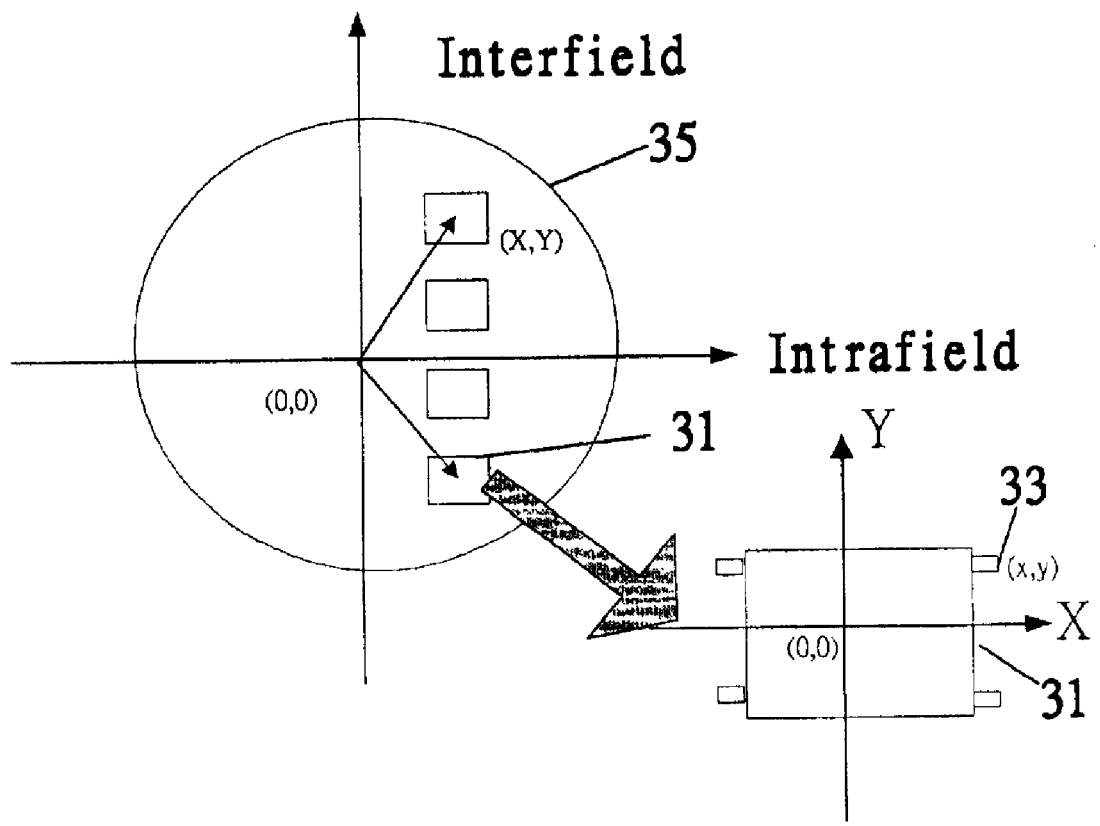
FIG. 3 is a sketch showing a sampling method for inter-field overlay and intra-field overlay on a wafer.
Figure 4:
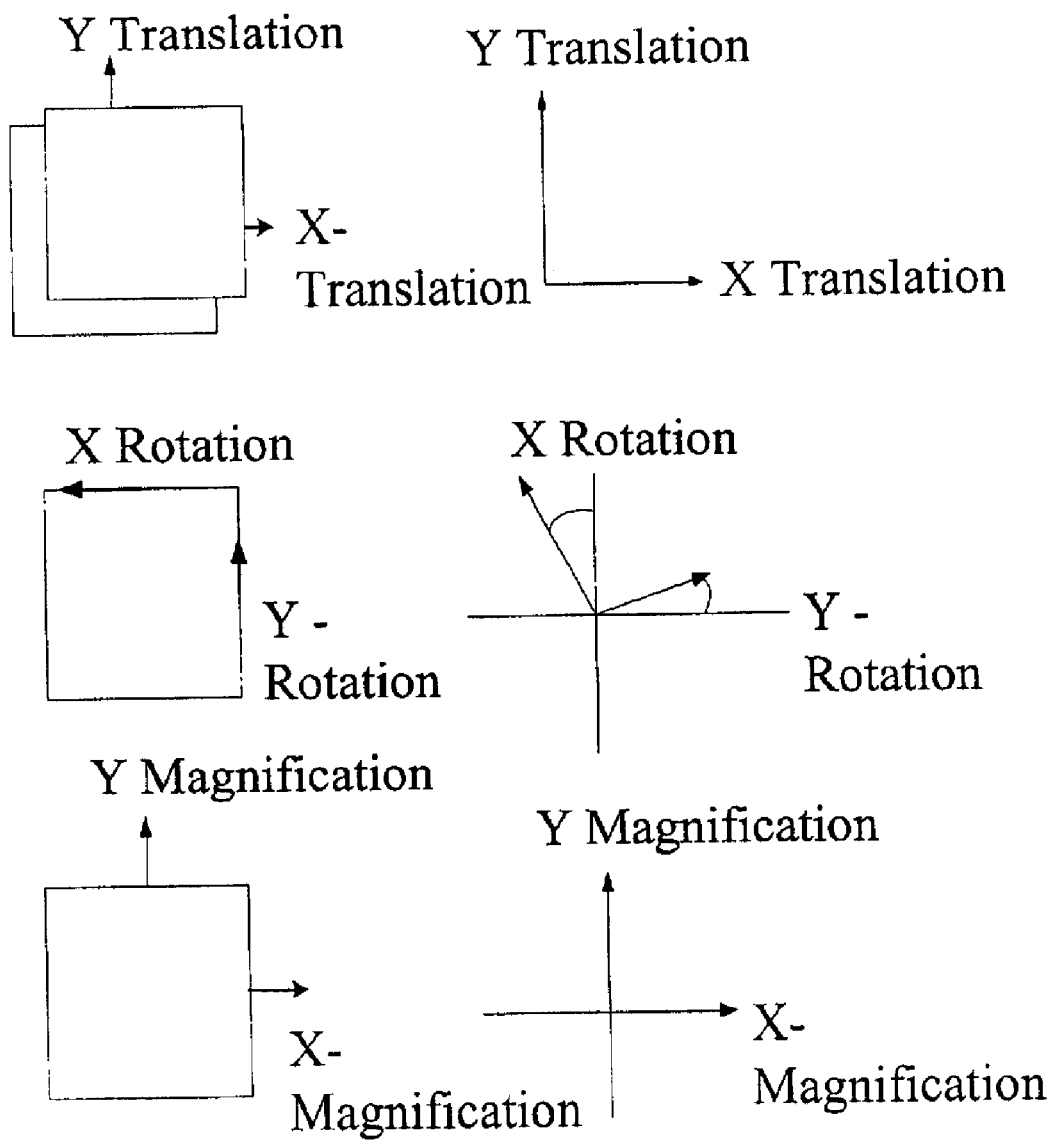
FIG. 4 is a sketch showing the factors related to intra-field overlay errors.
Figure 5:
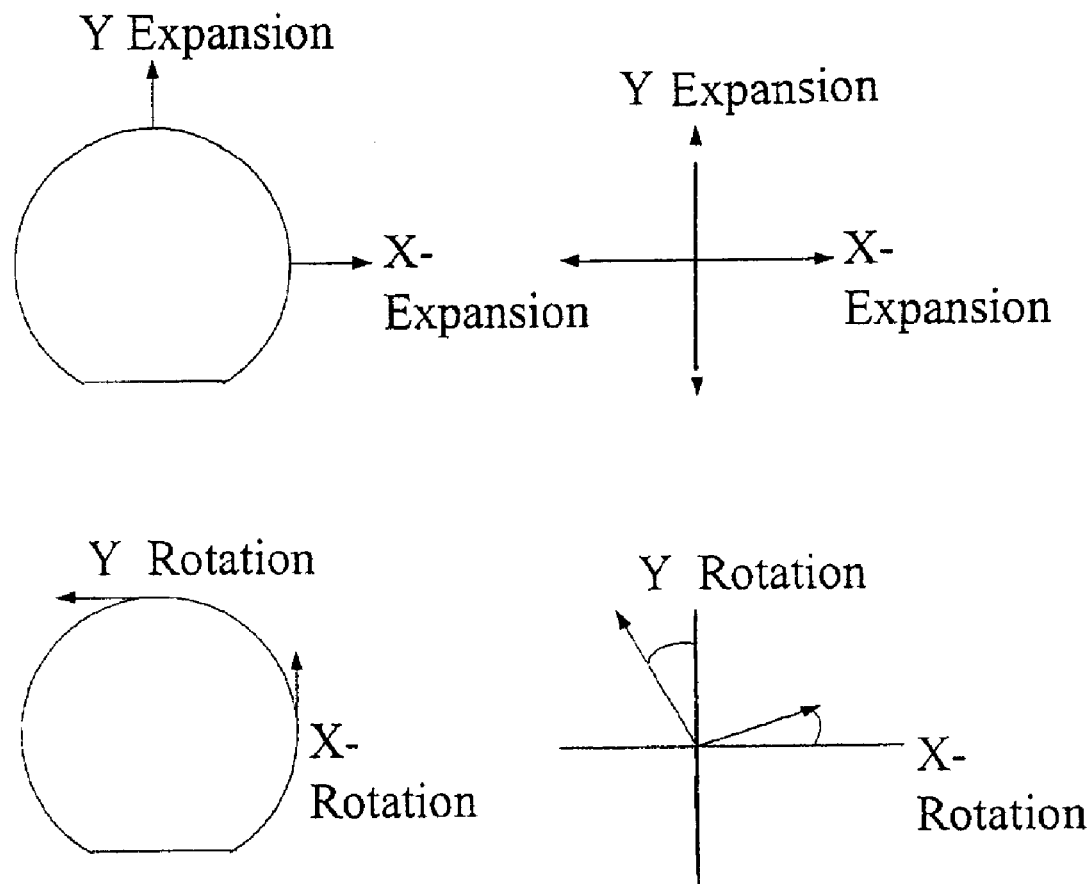
FIG. 5 is a sketch showing the factors related to inter-field overlay errors.

Reference will now be made in detail to the present preferred embodiments of the invention, examples of which are illustrated in the accompanying drawings. Wherever possible, the same reference numbers are used in the drawings and the description to refer to the same or like parts.

In this invention, actual measurements by a stepping machine are analyzed to obtain a series of geometric properties of overlay errors such as expansion parameter (E) in the inter-field overlay error pattern. Typically, the overlay error increases towards the edges of a wafer. In addition, for rotation parameter (R), both inter-field and intra-field overlay error patterns include entirely different rotation pattern.

Hence, for inter-field overlay errors, this invention utilizes actual measurements, simulations and statistics produced by the stepping machine to select four most important parameters including translation (T), magnification (M), rotation (R) and expansion (E). Ultimately, an inter-field overlay model is obtained having the following formulas:

$$d_X = T_X + E_X X - R_X Y + r_X \quad (15)$$

$$d_Y = T_Y + E_Y Y - R_Y X + r_X \quad (16)$$

However, actual measurements and error compensations of the parameters $R_X$ and $R_Y$ in manufacturing are based on non-positive crossing (N) parameter and angular rotation (θ) parameter. Hence, a variable transformation of the rotation parameter (R) is required. Assume, $$N = \frac{R_X - R_Y}{2} \quad (17)$$

$$\theta = \frac{R_X + R_Y}{2} \quad (18)$$

the inter-field overlay model according to this invention uses the following formulas:

$$d_X = T_X + E_X X - (N+\theta)Y + r_X \quad (19)$$

$$d_Y = T_Y + E_Y Y - (\theta-N)X + r_X \quad (20)$$

Similarly, for intra-field overlay errors, this invention utilizes actual measurements, simulations and statistics produced by the stepping machine to select three most important parameters including translation (T), magnification (M)

and rotation (R). Ultimately, an intra-field overlay model is obtained having the following formulas:

$$d_x = T_x + M'_x x - R_x y + r_x \quad (21)$$

$$d_y = T_y + M'_y y + R_y x + r_y \quad (22)$$

For a lens having a magnification M, the variable $M'_x$ is defined to be $M'_x = \Delta M = M*M_x$. In other words, $M'_x$ is a multiple of $M_x$ and the multiple is dependent upon the magnification of the lens.

The inter-field overlay model formulated in equations (19) and (20) and the intra-field overlay model formulated in equations (21) and (22) are combined, thus producing the following integrative overlay error model formulas:

$$d_{x+X} = T_{x+X} + E_X X - (N+\theta)Y + M'_x x - R_x y + r_{x+X} \quad (23)$$

$$d_{y+Y} = T_{y+Y} + E_Y Y - (\theta - N)X + M'_y y + R_y x + r_{y+Y} \quad (24)$$

The integrative overlay error model of this invention has several advantages. The total number of parameters considered is kept to a minimum so that the model can be easily implemented with minimal cost. Moreover, all the parameters used in this invention can be measured in actual production process so that the errors can be compensated directly. Thus, measured data and set variables are linked together by the integrative overlay error model.

After deciding upon the integrative overlay error model, the type of sampling strategy must be determined so that the parameters used in the model can be assessed and compensated. A strategic sampling procedure involves several stages. In the first stage, intra-field overlay states must be determined. In other words, the number and location of intra-field overlays are selected. In the second stage, the total number of sampled overlays on a wafer is determined so that the number and location of the intra-field overlay states on the wafer is set. In other words, the inter-field overlay pattern is determined. In the third stage, according to the model provided in this invention, related R-square values between different intra-field overlay states are estimated for identical positioning on the wafer. In the fourth stage, according to the model provided in this invention and under identical intra-field overlay states, in other words, based on the highest related R-square found in the third stage, related R-square values between different inter-field overlay patterns are estimated. Finally, in the fifth stage, based on the aforementioned results and actual wafer microlithographic process, the best overlay error sampling procedure is selected for compensating overlay errors. The following is a detailed description of the strategic sampling procedure.

Figure 6:
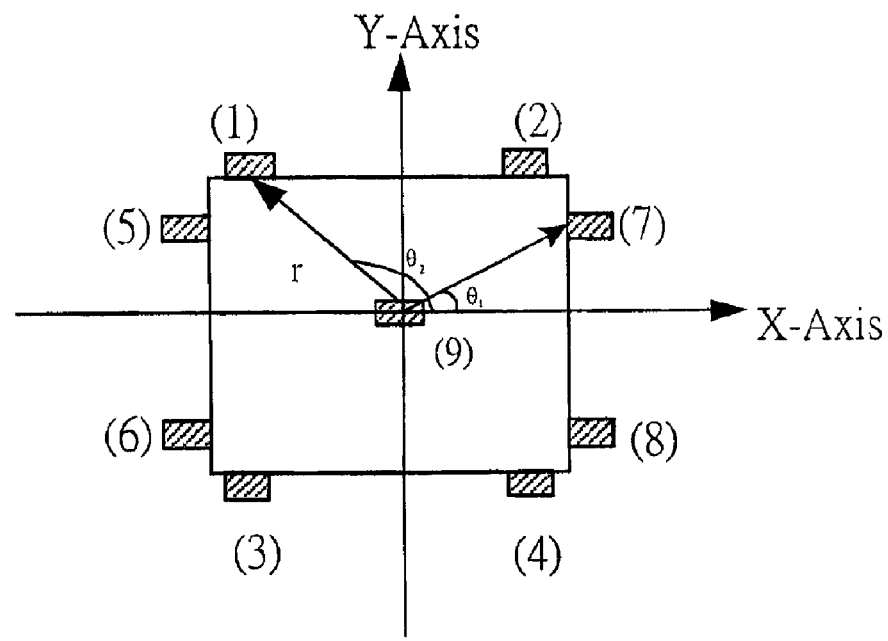
FIG. 6 is an intra-field overlay sampling scheme according to one preferred embodiment of this invention.

In stage one, intra-field overlay sampling states are determined. According to formulas (23) and (24), the overlay errors and the intra-field coordinates (x, y) are related. In actual measurement, the intra-field straight coordinate (x, y) is transformed into a polar coordinate (r, θ). FIG. 6 is an intra-field overlay sampling scheme according to one preferred embodiment of this invention. In FIG. 6, selected peripheral overlay regions (1)–(8) are at a radius r from a central region (9) and an included angle θ forms between the radius vector and the x coordinate axis. The number of intra-field overlay samples to be used has been investigated in the past [12]. In production applications, each field selected on a wafer shown in FIG. 6 will pick up five of the nine overlays for measurements. The five overlays includes the central overlay (9) and four of the eight peripheral overlays (1)–(8).

According to the above sampling scheme, altogether 70 types of intra-field overlay states are produced. Due to cost and yield considerations, not every one of the intra-field overlay states is selected.

According to the intra-field overlay model formulas (21) and (22), parameters including translation (T), magnification (M) and rotation (R) are all related to intra-field overlay errors. The effect of translation on overlay is a constant. The magnification for the overlays (1) and (2) along the y-axis are identical. Similar properties exist for the overlay pairs (3) and (4), the overlay pairs (5) and (7) and the overlay pairs (6) and (8). In like manner, the magnification for the overlays (1) and (3) along the x-axis are identical. Similar properties exist for the overlay pairs (2) and (4), the overlay pairs (5) and (6) and the overlay pairs (7) and (8). For the rotation parameter, the larger the angular difference $(\theta_2 - \theta_1)$ between overlays, the more accurate the estimation for the parameters $R_x$ and $R_y$. This is because a larger increase in $\theta_2 - \theta_1$, even if one of the selected region has minor rotation, leads the formulas (21) and (22) to develop into a greater difference. Hence, the parameters $R_x$ and $R_y$ can be estimated more accurately.

Figure 7:
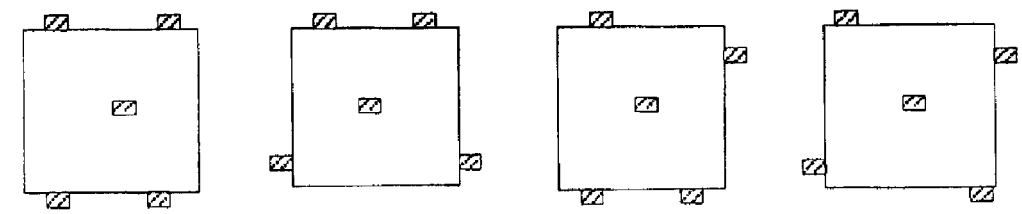
FIG. 7 is a sketch of the eight types of intra-field overlay position sampling states according to one embodiment of this invention.
Figure 7:
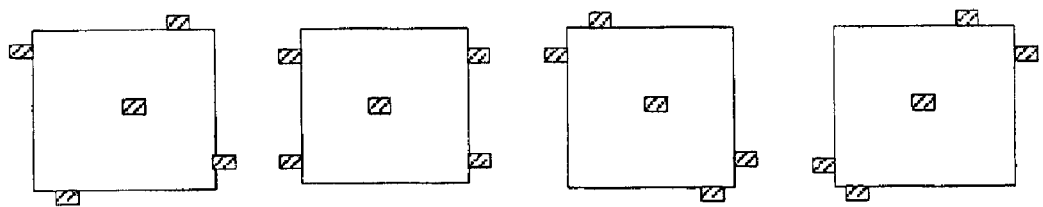

To test the above rules to determine the best intra-field overlay sampling state, the overlays in FIG. 6 are divided into four different pairings. The pairs include (1) and (5), (2) and (7), (3) and (6) and (4) and (8). An overlay is selected from each pair. In theory, there are altogether 2×2×2×2=16 combinations. After careful selection, six representative states are chosen in the invention. FIG. 7 is a sketch of the eight types of intra-field overlay position sampling states according to one embodiment of this invention. As shown in FIG. 7, the states includes (a) to (f) and two sampling states (1)(5)(4)(8) and (2)(7)(3)(6), that is, (g) and (h). Thus, this invention provides altogether nine sampling states for analyzing intra-field overlay model errors.

Figure 8:
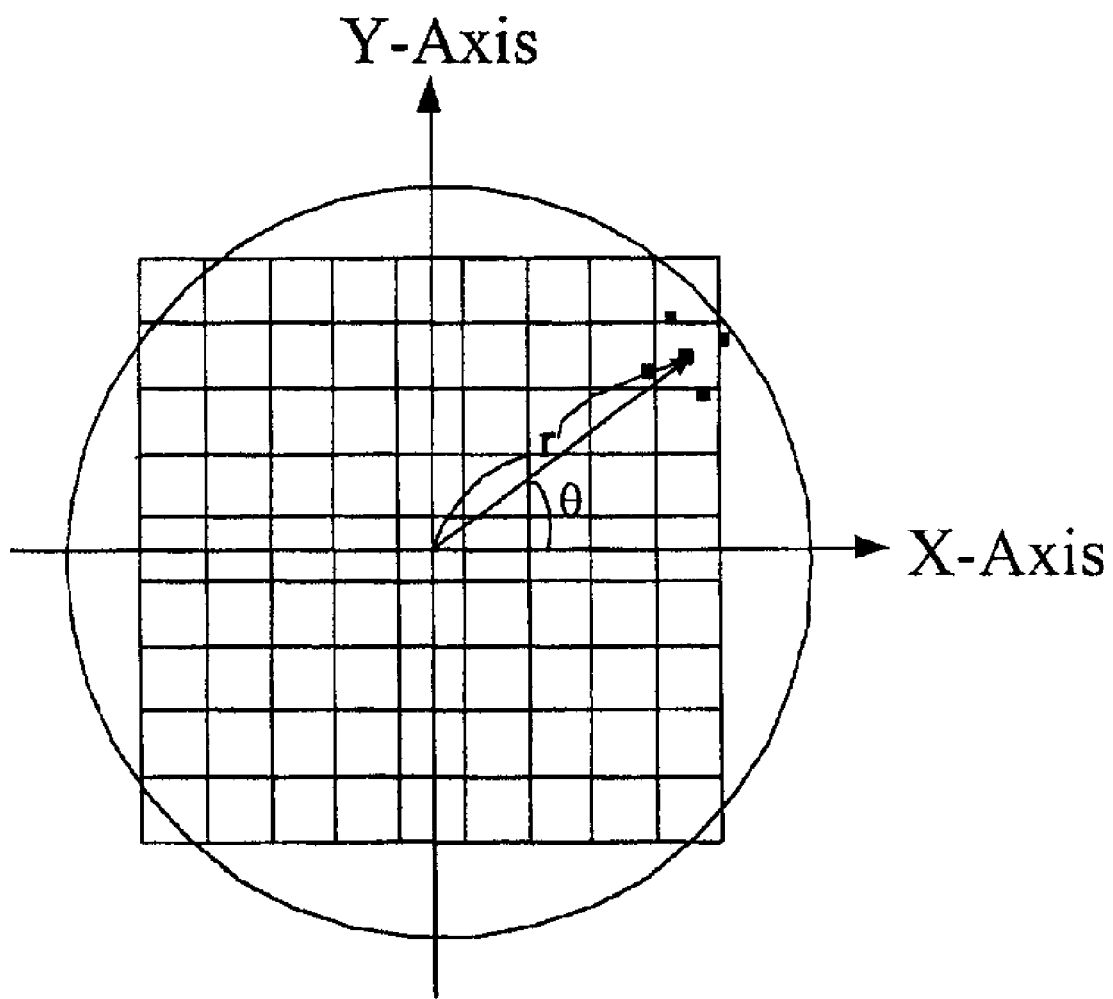
FIG. 8 is a sketch of an inter-field overlay sampling scheme according to one embodiment of this invention.
Figure 9:
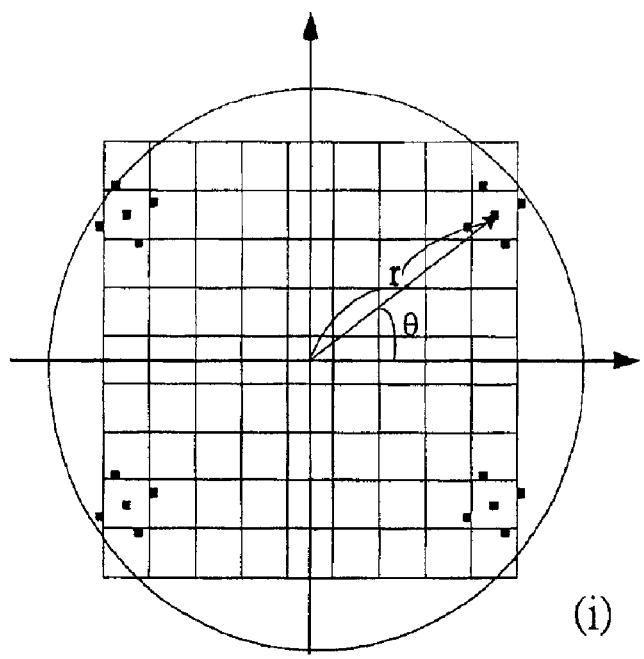
FIG. 9 is a sketch of an inter-field overlay sampling pattern (i) according to one embodiment of this invention.
Figure 10:
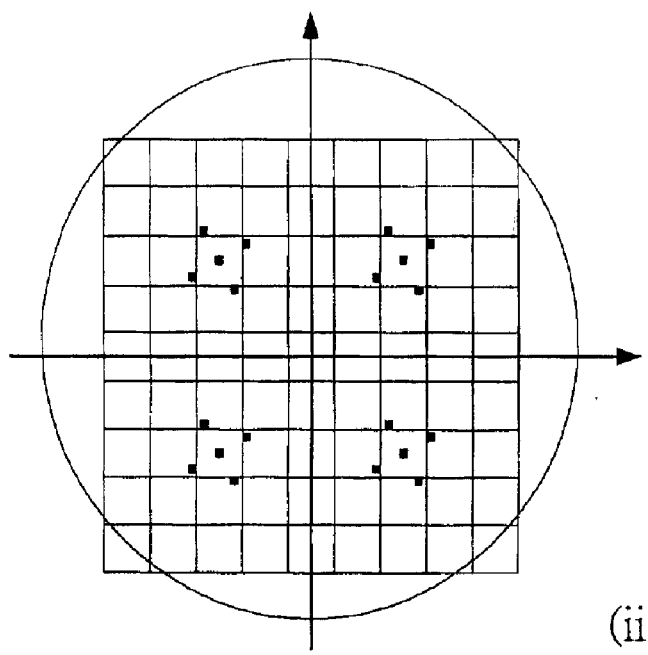
FIG. 10 is a sketch of an inter-field overlay sampling pattern (ii) according to one embodiment of this invention.
Figure 11:
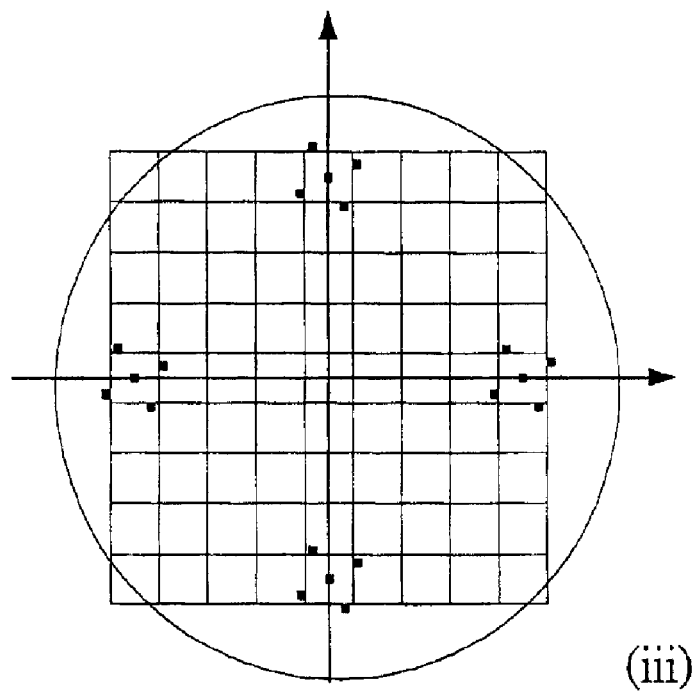
FIG. 11 is a sketch of an inter-field overlay sampling pattern (iii) according to one embodiment of this invention.
Figure 12:
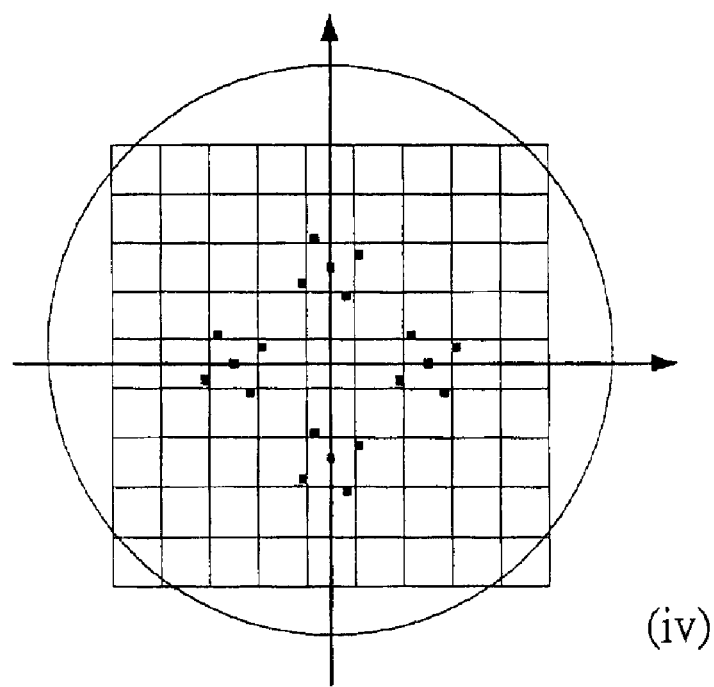
FIG. 12 is a sketch of an inter-field overlay sampling pattern (iv) according to one embodiment of this invention.
Figure 13:
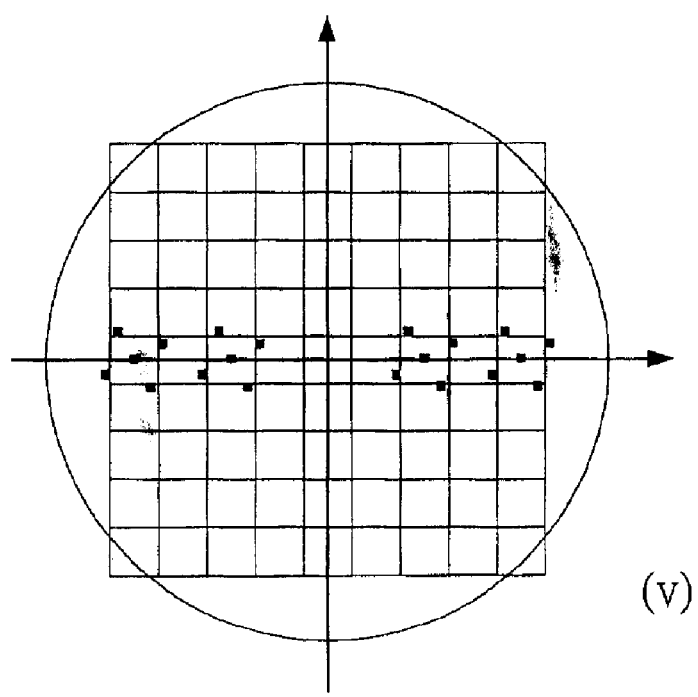
FIG. 13 is a sketch of an inter-field overlay sampling pattern (v) according to one embodiment of this invention.
Figure 14:
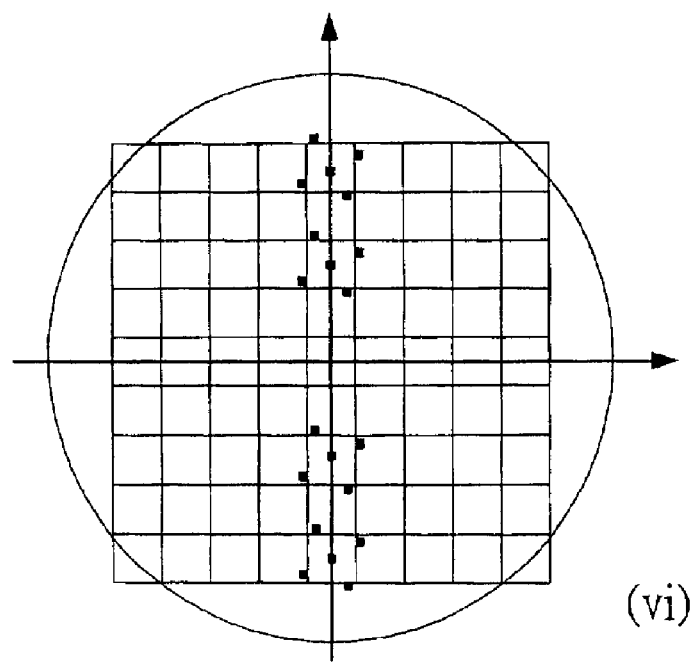
FIG. 14 is a sketch of an inter-field overlay sampling pattern (vi) according to one embodiment of this invention.
Figure 15:
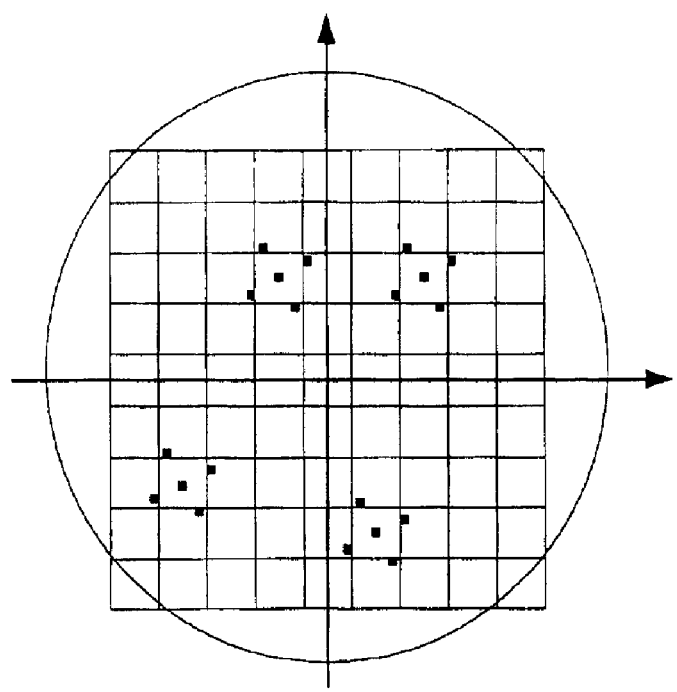
FIG. 15 is a sketch of an inter-field overlay sampling pattern (vii) according to one embodiment of this invention.
Figure 16:
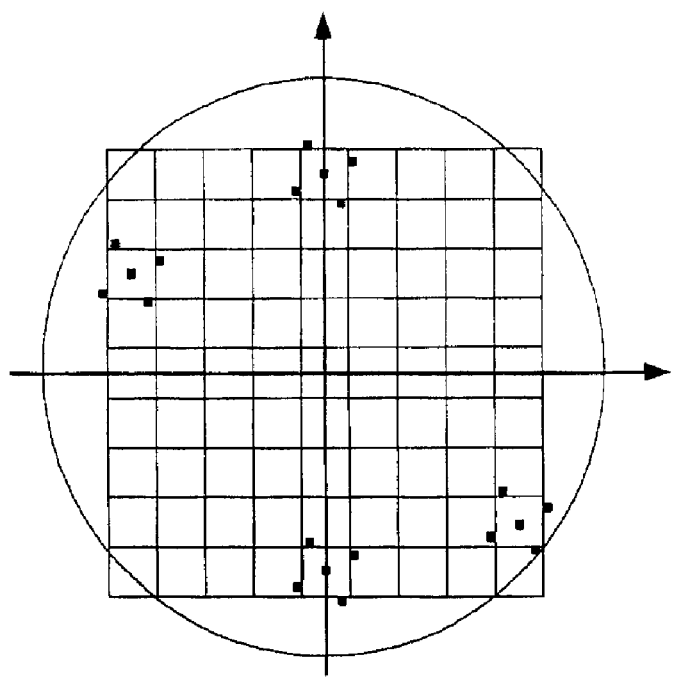
FIG. 16 is a sketch of an inter-field overlay sampling pattern (viii) according to one embodiment of this invention.
Figure 17:
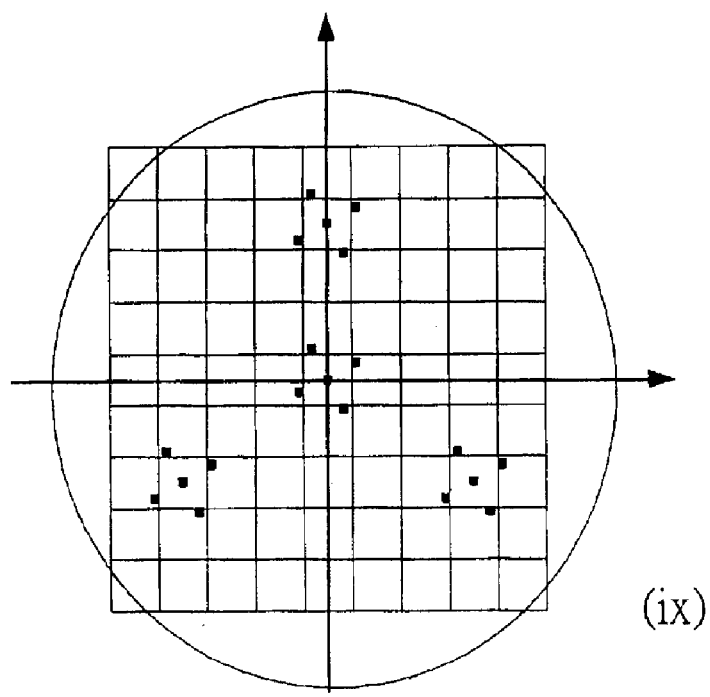
FIG. 17 is a sketch of an inter-field overlay sampling pattern (ix) according to one embodiment of this invention.
Figure 18:
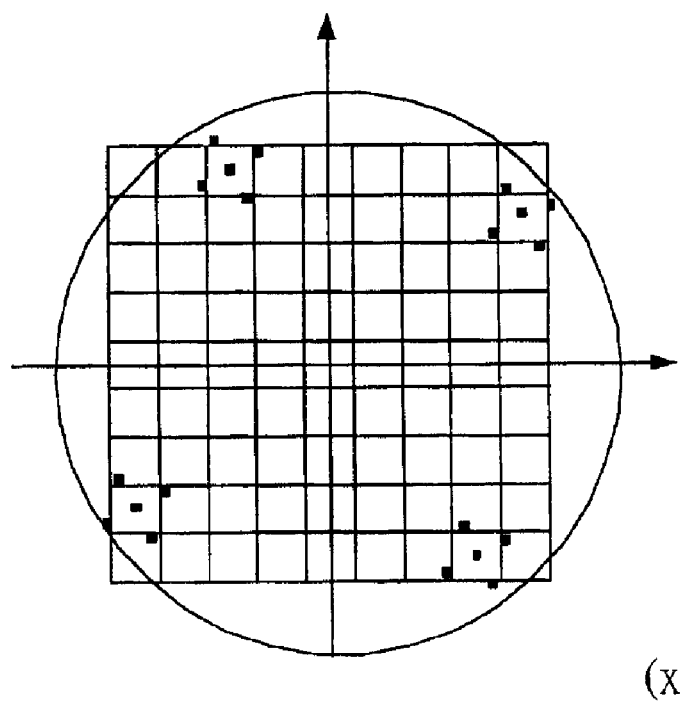
FIG. 18 is a sketch of an inter-field overlay sampling pattern (x) according to one embodiment of this invention.

In stage two, inter-field overlay sampling patterns are determined. After the determination of intra-field overlay sampling states (including the number and location of overlays in the intra-field), the number of overlay samples from the wafer is selected. Hence, the distribution of number and location of intra-field overlay states on the wafer can be determined. In a word, inter-field overlay sampling patterns are determined. FIG. 8 is a sketch of an inter-field overlay sampling scheme according to one embodiment of this invention. To carry out inter-field sampling according to this invention, the inter-field straight coordinate (X, Y) is transformed into a polar coordinate (r, θ).

Before carrying out inter-field overlay sampling, the number of overlays used in the wafer must first be determined. According to size and quality of production wafers, the number of wafer overlays selected includes 10, 20, 50, 100, 200 and 255. Using the determined inter-field overlay states as a base, a five-overlay selection is also included. However, if 255 overlays are chosen on the wafer, altogether 51 inter-field overlay states may be positioned across the wafer. Under the same token, a 200-overlay selection will produce 40 inter-field overlay states and 20-overlay selection will produce four inter-field overlay states. All these inter-field overlay states on the wafer are commonly referred to as 'inter-field overlay sampling patterns'.

In general, a greater number of overlays selected on the wafer yields more accurately measured overlay errors. However, cost of such measurements also increases proportionately. Therefore, increasing assessment accuracy without a corresponding increase in cost is a major issue in this invention.

A comparison for different number of overlays on a wafer is described in a subsequent section. Here, the number of overlays used in this invention is the number likely to be chosen by wafer manufacturers such as 20. FIGS. 9–18 are sketches of inter-field overlay sampling patterns according to the embodiment of this invention.

In FIG. 8, a related method of selecting inter-field overlays is shown. Radius r is the distance from the center of the wafer to the center of a particular selected overlay. Angle θ is an angular measurement whose pattern is similar to the one in FIG. 7. According to the formulas (19) and (20) of the inter-field overlay model, expansion parameters $E_X$ and $E_Y$ are related to the coordinate (X, Y) such that $E_X$ is related to X while $E_Y$ is related to Y. Simulation of the expansion parameter patterns have indicated that overlay errors increase towards the outer edges of the wafer. Even if there is only minor expansion near the central region of the wafer, the outer region of the wafer may accumulate substantial overlay errors. Hence, overlays in the outer edge regions will have a greater radius r. Since overlay errors are greater in these outer regions, compensation is also much easier. Thus, the selection of overlays in the outer wafer region is better able to find the expansion parameters $E_X$ and $E_Y$.

To estimate the difference in inter-field overlay sampling, this invention provides an inter-field sampling strategy. The sampling strategy pays close attention to the radius r and the angle θ. As shown in FIGS. 9–18, the strategy includes ten different inter-field overlay sample patterns. The radius r is the distance between the origin of the wafer to the selected region while the angle θ is the rotation angle shown in FIG. 9. The inter-field overlay sampling location in each pattern is represented by state (d) in FIG. 7.

In stage three, inter-field sampling states are compared. As shown in FIG. 7, eight different overlay location sample states are employed in this invention. Each sampling state has five overlays including four peripheral overlays and one central overlay. To compare different sampling states, different overlay numbers and related square coefficients (R-square values) of the model provided by this invention, a multiple linear regression analysis [5] is used to find a model similar to the one depicted by formulas (23) and (24). In addition, the least square method is used to estimate corresponding parametric and related R-square values.

To obtain related inter-field overlay sample states, related R-square values of the aforementioned eight sampling states are compared in relationship with the different overlay sample numbers such as 255, 100, 50, 20 and 10. Because each selected region has five overlays, 51 regions (not shown) are produced if a decision to use 255 overlays is chosen. Other overlay numbers may be selected in wafer sampling and compared. The related square coefficients resulting from a comparison between the inter-field sampling state and the sampling number are listed in Table 3. The sampling states in Table 3(1) are identical to state (a) in FIG. 7, which is the sampling states currently employed by wafer manufacturers. Due to cost consideration, an overlay sampling number of twenty is employed by most wafer manufacturers.

TABLE 3

Related square coefficients between intra-field sampling states and sampling numbers

| Overlay sample number | Intra-state sampling state | | | | | | | |
|---|---|---|---|---|---|---|---|---|
| | (a) | (b) | (c) | (d) | (e) | (f) | (g) | (h) |
| 255 | 99.4% | 99.7% | 99.4% | 99.6% | 99.8% | 99.7% | 99.6% | 99.8% |
| 100 | 97.2% | 94.7% | 96.1% | 98.1% | 99.3% | 95.2% | 93.1% | 95.4% |
| 50 | 95.8% | 97.2% | 96.7% | 98.3% | 96.5% | 95.1% | 90.6% | 94.1% |
| 20 | 87.1% | 96.8% | 92.1% | 96.5% | 91.0% | 88.5% | 76.7% | 81.1% |
| 10 | 71.5% | 83.2% | 61.2% | 83.6% | 79.7% | 73.8% | 52.5% | 69.7% |

According to the results in Table 3, measured errors between different sampling states are minor when the number of sampling overlays is relatively large (for example, 255 and 100). However, when the sampling number is relatively small (for example, 10 and 20), significant differences in measured errors are observed. Considering the sampling number employed by most wafer manufacturers (typically twenty overlays), the sampling states (d) in FIG. 7 have a higher resemblance and a smaller residual parametric values when compared with conventional sampling state (state (a) in FIG. 7).

Figure 19:
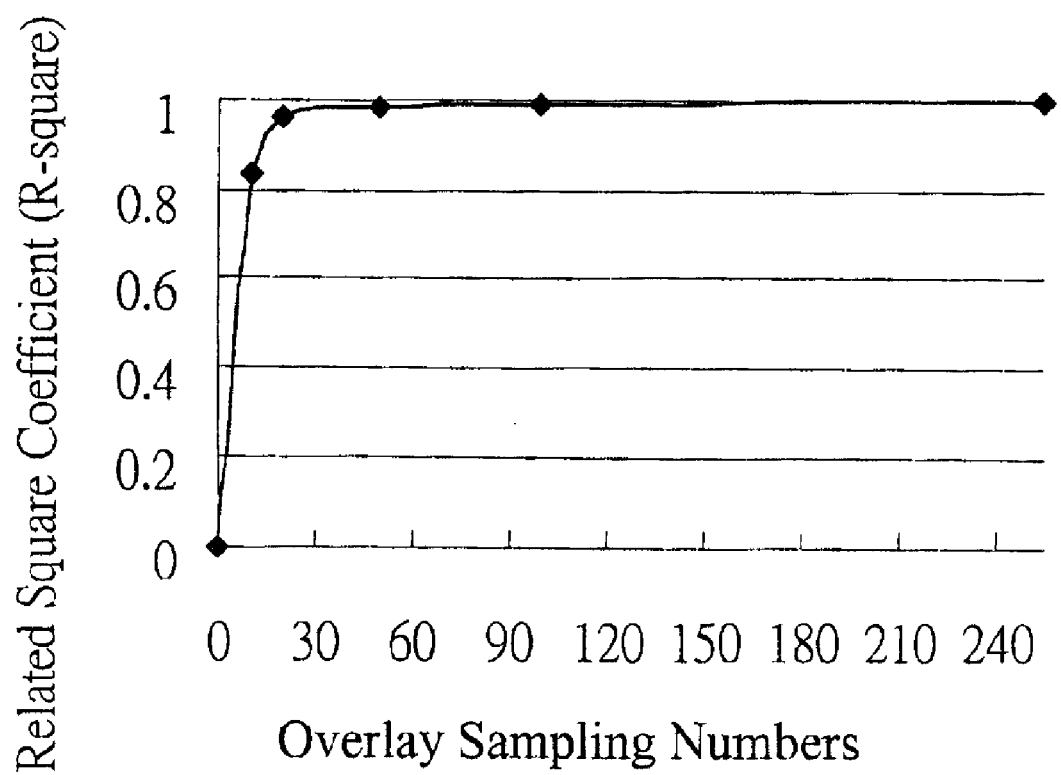
FIG. 19 is a graph showing the relationship between related square coefficient and the overlay sampling number according to the embodiment of this invention.

The results in Table 3 also show that as the number of sampling overlays increases, higher R-square values are obtained. This implies that as the number of sampling increases, more data are obtained so that better error compensation is possible. FIG. 19 is a graph showing the relationship between related square coefficients and the overlay sampling numbers according to the embodiment of this invention. The graph is based on column (d) of Table 3. Hence, a strategic planner with consideration only of inter-field factors may decide the number of sampling overlays (sampling cost) and the resemblance of the overlay error model (level of related square coefficients) through the data presented in FIG. 19. In other words, this invention provides a systematic decision method that can be built into related equipment.

In the fourth stage, inter-field sampling patterns are compared. According to FIGS. 9–19, ten different sampling patterns are provided. Each sampling pattern has four selected regions based on radius of the wafer and rotated angle. Each region further includes five overlaying points. Therefore, each type of sampling pattern has altogether twenty overlays, which are based on the sampling number of most current wafer manufacturers. To compare various inter-field sampling patterns, this invention also employs a multiple linear regression analysis to derive the formulas (23) and (24) provided by the model. In addition, a least square method is used to estimate corresponding parametric values and related square coefficients between different sampling patterns.

The results of comparing related square coefficients between inter-field sampling patterns and intra-field sampling states are shown in Table 4 below. The sampling pattern (i) is the current sampling method employed by current wafer manufacturers.

TABLE 4

Parametric values of inter-field sampling patterns and related R-square values

| Parametric value and related R-square value | Inter-field sampling pattern | | | | | | | | | | True Value |
|---|---|---|---|---|---|---|---|---|---|---|---|
| | (i) | (ii) | (iii) | (iv) | (v) | (vi) | (vii) | (viii) | (ix) | (x) | |
| $T_X$ (μm) | −0.416 | −0.157 | −0.144 | −0.172 | −0.20 | −0.160 | −0.177 | −0.156 | −0.181 | −0.164 | −0.167 |
| $T_Y$ (μm) | −0.122 | −0.134 | −0.119 | −0.117 | −0.09 | −0.135 | −0.123 | −0.137 | −0.128 | −0.132 | −0.128 |
| $\theta$ (μrad) | 0.019 | 0.033 | 0.035 | 0.033 | 0.029 | 0.005 | 0.009 | 0.017 | 0.013 | 0.019 | 0.021 |
| $E_x$ (ppm) | 0.12 | 0.073 | 0.092 | 0.067 | −0.008 | 0.077 | 0.078 | 0.008 | 0.092 | 0.087 | −0.094 |
| $E_y$ (ppm) | 0.16 | 0.29 | 0.21 | 0.05 | 0.012 | −0.012 | 0.035 | 0.123 | 0.044 | 0.21 | 0.19 |
| N (μrad) | 0.008 | 0.023 | 0.011 | 0.002 | 0.004 | 0.07 | 0.005 | 0.012 | 0.012 | 0.005 | 0.005 |
| Related R-square | 94.1% | 87.2% | 91.3% | 86.5% | 72.5% | 80.1% | 88.3% | 95.6% | 86.6% | 96.7% | |
| Error Norm | 0.442 | 0.691 | 0.532 | 0.897 | 0.889 | 0.801 | 0.712 | 0.423 | 0.884 | 0.401 | |

According to the results shown in Table 4, the following conclusions can be drawn: (1) if the number of sample is restricted, a larger sampling point radius and a more symmetrical sampling pattern produce a higher related R-square value; (2) if rotational errors are present, inter-field sampling pattern (i) is much better at estimating an accurate rotation angle relative to other sampling patterns; and (3) if expansion errors are present, inter-field sampling pattern (iii) is much better at estimating an accurate rotation angle relative to other sampling patterns. Hence, strategic planners can select the sampling pattern for the wafer and the degree of resemblance of the overlay error model (magnitude of R-square values) based on the data shown in Table 4.

In stage five, sampling strategies are integrated. To measure overlay error precisely during in-process manufacturing, inter-field sampling pattern (a wafer factor) must be considered aside from intra-field overlay states (a masking factor).

As shown in FIG. 7 and FIGS. 9–18, there are altogether eight types of intra-field overlay sampling states. Each sampling state has 10 inter-field sampling patterns. Hence, a complete sampling includes 80 combinations. Table 5 uses the formulas (23) and (24) to estimate and compare the aforementioned 80 types of combination and produces related square coefficients. Therefore, an effective and high resemblance sampling strategy that fits the model of this invention is generated.

According to the results in Table 5, the intra-field sampling states (d) and (e) have high R-square values. Hence, no matter what type of inter-field sampling pattern is chosen, the intra-field sampling states (d) and (e) have optimal square coefficients. Compared with Table 4, radius is larger, sampling pattern is more symmetrical and related square coefficients are higher. Thus, the intra-field sampling state (d) and the inter-field sampling pattern (viii) and (x) combination produce higher square coefficients.

TABLE 5

Related square coefficients of intra-field sampling state and inter-field sampling pattern

| Inter-field sampling pattern | Intra-state sampling state | | | | | | | |
|---|---|---|---|---|---|---|---|---|
| | (a) | (b) | (c) | (d) | (e) | (f) | (g) | (h) |
| (i) | 90.1% | 91.3% | 89.7% | 94.1% | 92.3% | 91.2% | 82.55% | 86.4% |
| (ii) | 87.5% | 87.2% | 84.5% | 87.2% | 90.1% | 88.5% | 73.1% | 86.2% |
| (iii) | 88.3% | 89.2% | 86.3% | 91.3% | 90.1% | 86.6% | 74.9% | 90.4% |
| (iv) | 85.3% | 84.2% | 83.5% | 86.5% | 87.1% | 87.2% | 72.6% | 85.5% |
| (v) | 72.3% | 71.5% | 73.6% | 72.5% | 72.3% | 79.7% | 61.2% | 67.8% |
| (vi) | 75.5% | 76.8% | 77.2% | 80.1% | 81.3% | 76.4% | 70.0% | 69.5% |
| (vii) | 89.1% | 88.2% | 84.5% | 88.3% | 87.2% | 88.2% | 80.1% | 81.3% |
| (viii) | 92.3% | 90.0% | 91.5% | 95.6% | 96.2% | 91.4% | 82.3% | 84.4% |
| (ix) | 87.1% | 82.3% | 82.3% | 86.6% | 85.5% | 81.1% | 82.9% | 75.5% |
| (x) | 91.3% | 90.1% | 89.7% | 96.5% | 93.1% | 89.95% | 83.4% | 89.8% |

However, in a conventional wafer manufacturing facility, operating all 80 types of sampling combinations is difficult. Hence, providing an integrative sampling strategy for the overlay error model of this invention is very important.

According to the aforementioned comparison, an integrative overlay sampling strategy is provided. The sampling procedure includes:

(a) determining the state within the intra-field, that is, determining the number and positions of the selected overlays within the intra-field for example, selecting four positions from (1)–(8) in FIG. 6 and the overlay (9) in the central position serving as the sampling state of the intra-field overlay location, and the intra-field overlay sampling state, for example, the eight types of intra-field overlay patterns in FIG. 7 as sampling state, thereafter, determining the sum of the overlays, for example, 10 to 255, and ranking each type of intra-field overlay sampling state similarly on the wafer, and measuring the locations and actual overlay error values of each overlay type of the sampling states within the intra-field;

(b) using the measured values and utilizing the least square method to obtain the coefficients according to the overlay error model formulas (23) and (24), computing related square coefficient values between each type of overlay sampling states within the intra-field and the overlay model (or R-square represents the degree of the assessed variance that can be explained by the model), selecting the highest related square coefficient among the overlay sampling states within the intra-field, for example, the intra-field sampling state (d);

(c) determining a plurality of inter-field overlay sampling patterns, that is, determining the locations and number of types of overlay sampling states within the inter-field, the location, for example, is in any one of the wafer grids in FIG. 8, the number is, for example, between 2 to 51 and the inter-field overlay sampling pattern is preferably the 10 types of pattern shown in FIGS. 9 to 18, wherein the intra-field state is selected according to the highest square coefficient in step (b), for example, the intra-field sampling state (d), and measuring the locations and actual overlay error values of each overlay sampling pattern within the inter-field;

(d) using the measured values in step (c) and utilizing the least square method to find the coefficients in the model formulas (23) and (24), and computing related square coefficient values between each overlay sampling pattern within the inter-field and the overlay model, selecting an inter-field overlay sampling pattern having the highest related square coefficients, for example, the inter-field overlay sampling pattern (viii) or (x); and (e) determining the combination of intra-field overlay sampling state and inter-field overlay sampling pattern and its relationship with the model so that the highest related coefficients are found, for example, the intra-field sampling state (d) and inter-field sampling pattern (viii) or the intra-field sampling state (d) and the inter-field sampling pattern (x), performing compensation and modification using the measured overlay errors for the same stepper machine so that the number of overlay errors of the exposed patterns is reduced to a tolerable range and yield of semiconductor device is improved.

According to the aforementioned overlay error model and overlay error sampling strategy, this invention also provides a device for implementing the model and the sampling strategy.

Figure 20:
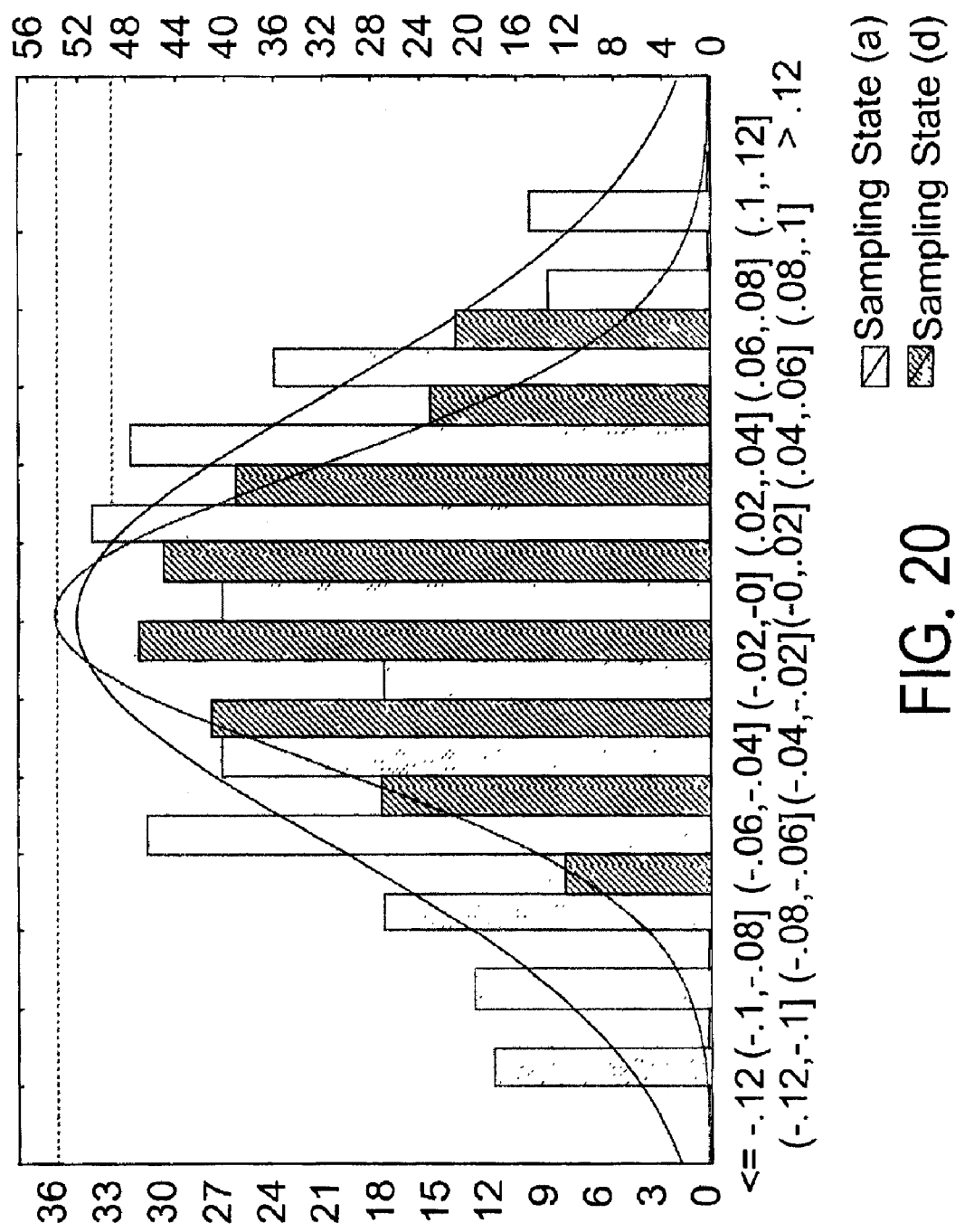
FIG. 20 is a bar graph showing residual value between a conventional intra-field overlay sampling state (a) and the optimized intra-field overlay sampling state (d) according to this invention.

The aforementioned related square coefficient indicates the degree of resemblance of the model. This invention uses the variable parameters in the overlay model to compensate for any overlay errors. The residual parameters of the intra-field sampling state (a) and intra-field sampling state (d) refer to portion of the overlay errors that cannot be compensated according to the estimation produced by the model. FIG. 20 is a bar graph showing residual value between a conventional intra-field overlay sampling state (a) and the optimized intra-field overlay sampling state (d) according to this invention. As shown in FIG. 20, the residual parameter of the sampling state (d) is more concentrated than the conventional sampling state. The overlay norm computation is carried out using the residual value produced by 255 overlay, and the norm value v is defined as:

$$\|v\| = \sqrt{r_1^2 + r_2^2 + \ldots + r_{255}^2} \quad (25)$$

Figure 21:
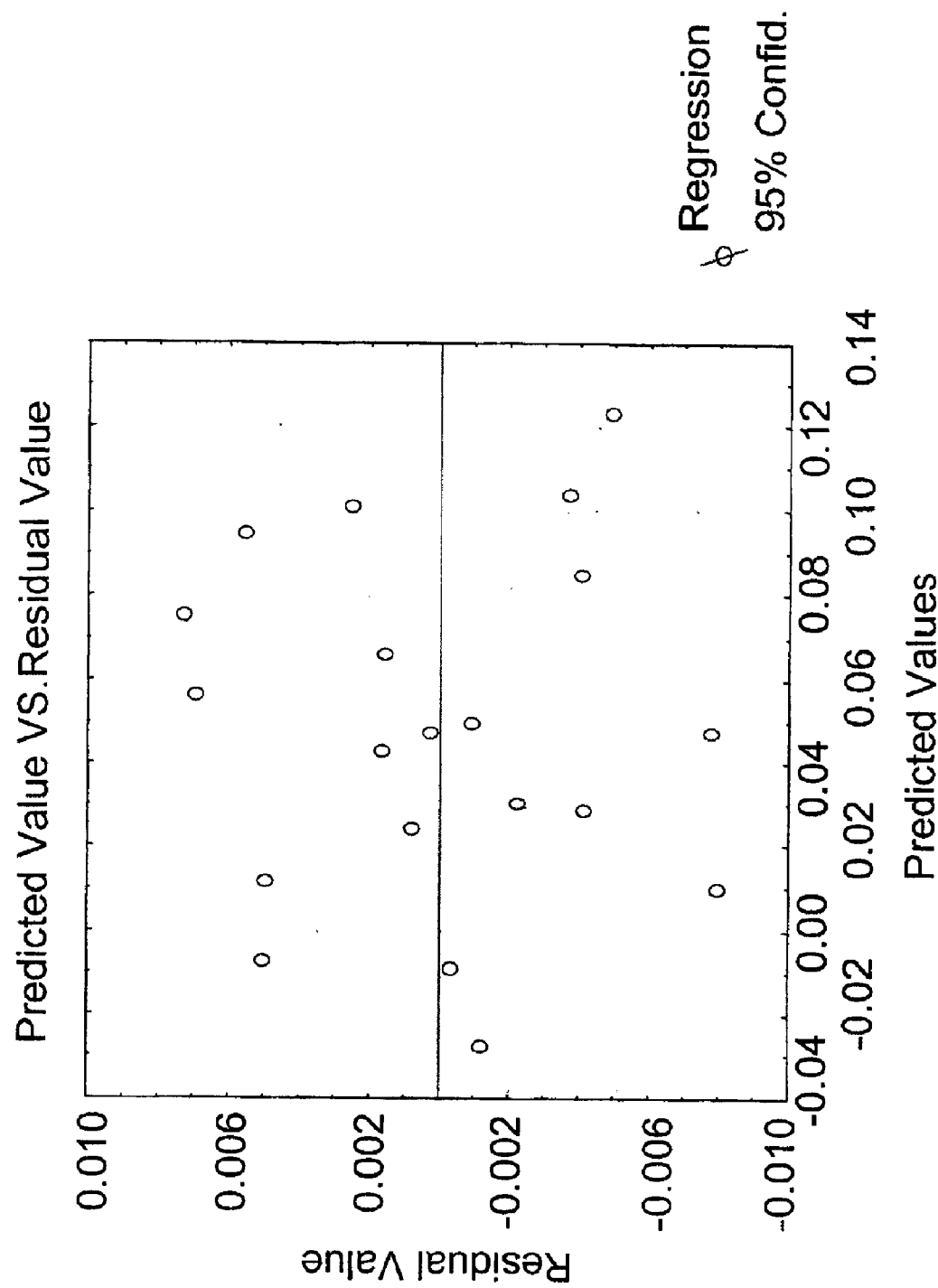
FIG. 21 is a graph analyzing the distribution of residual value in the intra-field overlay sampling state (d) according to this invention.

Hence, the calculated value of the sampling state (d) for the overlay error norm is 0.598 while the overlay error norm for the sampling state (a) is 0.924. For sampling state (1), this indicates that sampling state (d) is able to reduce about 35.4 percent more overlay error and the residual analysis of the sampling state (d) also shows the effectiveness and advantage of the model provided by this invention. FIG. 21 is a graph analyzing the distribution of residual value in the intra-field overlay sampling state (d) according to this invention.

In the measurement of overlay errors, the relationship between the sample number and the related square coefficient can be assessed based on the sampling cost and the effectiveness of the compensation as shown in FIG. 19. According to the current model and actual wafer manufacturing facilities, this invention provides an innovative intra-field and inter-field overlay model. Using data from an effective estimation to modify overlay errors, a sampling location better than those found by conventional methods is obtained. Hence, this invention is capable of reducing overlay errors by up to 35.4 percent.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A strategic sampling procedure for measuring overlay errors, including:

(a) determining a state within an intra-field, including determining the number and positions of selected overlays within the intra-field, determining each type of sampling state and sum of the selected overlays, ranking each type of intra-field overlay sampling state similarly on a wafer, and measuring locations and actual overlay error values of each overlay type of sampling states within the intra-field;

(b) using the measured values and utilizing a least square method to obtain coefficients according to overlay error model formulas (23) and (24), computing related square coefficient values between each type of overlay sampling states within the intra-field and the overlay model where R-square represents the degree of assessed variance explained by the model selecting a highest related square coefficient among the overlay sampling states within the intra-field so that model compensation is improved;

(c) determining a plurality of inter-field overlay sampling patterns, including determining locations and number of types of overlay sampling states within the inter-field, and together with the selected highest square coefficient from the overlay states within the intra-field in step (b), measuring locations and actual overlay error values of each overlay sampling pattern within the inter-field;

(d) using the measured values in step (c) and utilizing the least square method to find the coefficients in the model formulas (23) and (24), and computing related square coefficient values between each overlay sampling pattern within the inter-field and the overlay model, selecting an inter-field overlay sampling pattern having the highest related square coefficients, thereby finding an optimal sampling pattern that corresponds to the model and improving an effect of model compensation; and (e) determining a combination of intra-field overlay sampling state and inter-field overlay sampling pattern and its relationship with the model so that the highest related coefficients are found, performing compensation and modification using the measured overlay errors for a stepper machine so that the number of overlay errors of exposed patterns is reduced and the yield of the semiconductor device is improved, wherein the overlay error model uses formulas as follows:

$$d_{x+X} = T_{x+X} + E_X X - (N+\theta)Y + M'_x x - R_y y + r_{x+X} \quad (23)$$

$$d_{y+Y} = T_{y+Y} + E_y Y - (\theta - N)X + M'_y y + R_y x + r_{y+Y} \quad (24)$$

with parameters in the model selected according to measured parameters and statistics, and setting $$N = \frac{R_x - R_y}{2}$$

$$\theta = \frac{R_x + R_y}{2}$$

where
- N: a non-positive crossing parameter;
- θ: an angular rotation parameter;
- x, y: intra-field coordinates that use a central point of a selected region as an origin;
- X, Y: inter-field coordinates that use a central point of a wafer as an origin;
- $d_{x+X}$, $d_{y+Y}$: sum of intra-field overlay error and inter-field overlay error in horizontal and vertical directions, respectively;
- $T_{x+X}$, $T_{y+Y}$: sum of intra-field translation error and inter-field translation error in the horizontal and the vertical directions, respectively;
- $E_{x+Y}$: inter-field expansion error;
- $M'_x$, $M'_y$: magnification error in the horizontal and the vertical directions, respectively;
- $R_x$, $R_y$: intra-field rotation error in the horizontal and the vertical directions, respectively;
- $R_X$, $R_Y$: inter-field rotation error in the horizontal and the vertical directions, respectively; and
- $r_{x+X}$, $r_{y+Y}$: sum of intra-field residue and inter-field residue in the horizontal and the vertical directions, respectively.

2. The strategic sampling procedure of claim 1, wherein in step (a), total number of overlays in each sampling state is between 10 and 255.

3. The strategic sampling procedure of claim 2, wherein in step (b), the highest related square coefficient is the inter-field overlay sampling state (d).

4. The strategic sampling procedure of claim 3, wherein in step (c), the number of types of inter-field overlay sampling patterns in each region is between 2 and 51.

5. The strategic sampling procedure of claim 1, wherein the least square method includes a multiple linear regression analysis.

* * * * *